United States Patent [19]

Guillotte et al.

[11] Patent Number: 5,012,322
[45] Date of Patent: Apr. 30, 1991

[54] SEMICONDUCTOR DIE AND MOUNTING ASSEMBLY

[75] Inventors: Paul A. Guillotte, Worcester; Paul Panaccione, Barre; Thomas J. Martiska, Shrewsbury; Jay J. Gagnon, Holden, all of Mass.

[73] Assignee: Allegro Microsystems, Inc., Worcester, Mass.

[21] Appl. No.: 50,662

[22] Filed: May 18, 1987

[51] Int. Cl.⁵ .............................................. H01L 23/28
[52] U.S. Cl. ........................................ 357/72; 357/81; 357/54; 357/49
[58] Field of Search ........................ 357/72, 81, 54, 49

[56] References Cited

U.S. PATENT DOCUMENTS

| | | | |
|---|---|---|---|
| 3,568,012 | 3/1971 | Ernst et al. | 317/234 |
| 3,691,628 | 9/1972 | Kim et al. | 29/577 |
| 4,136,352 | 1/1979 | Moutou et al. | 357/81 |
| 4,268,848 | 5/1981 | Casey et al. | 357/72 |
| 4,278,990 | 7/1981 | Fichot | 357/81 |
| 4,330,790 | 5/1982 | Burns | 357/72 |
| 4,450,471 | 5/1984 | Wellhöefer et al. | 357/81 |
| 4,510,519 | 4/1985 | Dubois et al. | 357/81 |
| 4,667,214 | 5/1987 | Sekimura et al. | 357/49 |

FOREIGN PATENT DOCUMENTS

| | | | |
|---|---|---|---|
| 57-69765 | 4/1982 | Japan | 357/81 |
| 61-99359 | 5/1986 | Japan | 357/81 |

Primary Examiner—William Mintel

[57] ABSTRACT

A uniformly thick dielectric polyimide coating is provided on the back face of an integrated circuit and the die is mounted to a copper lead frame finger by interposing an epoxy resin bonding agent between the uniformly thick polyimide coating and the copper support finger. The die coating is provided before separating die from the precursive water. Liquid polyimide is poured onto the back side of the water which is spun, in a manner similar to that usually used for obtaining uniformly thick photoresist films. After curing the polyimide, the die are cut from the wafer by sawing.

6 Claims, 1 Drawing Sheet

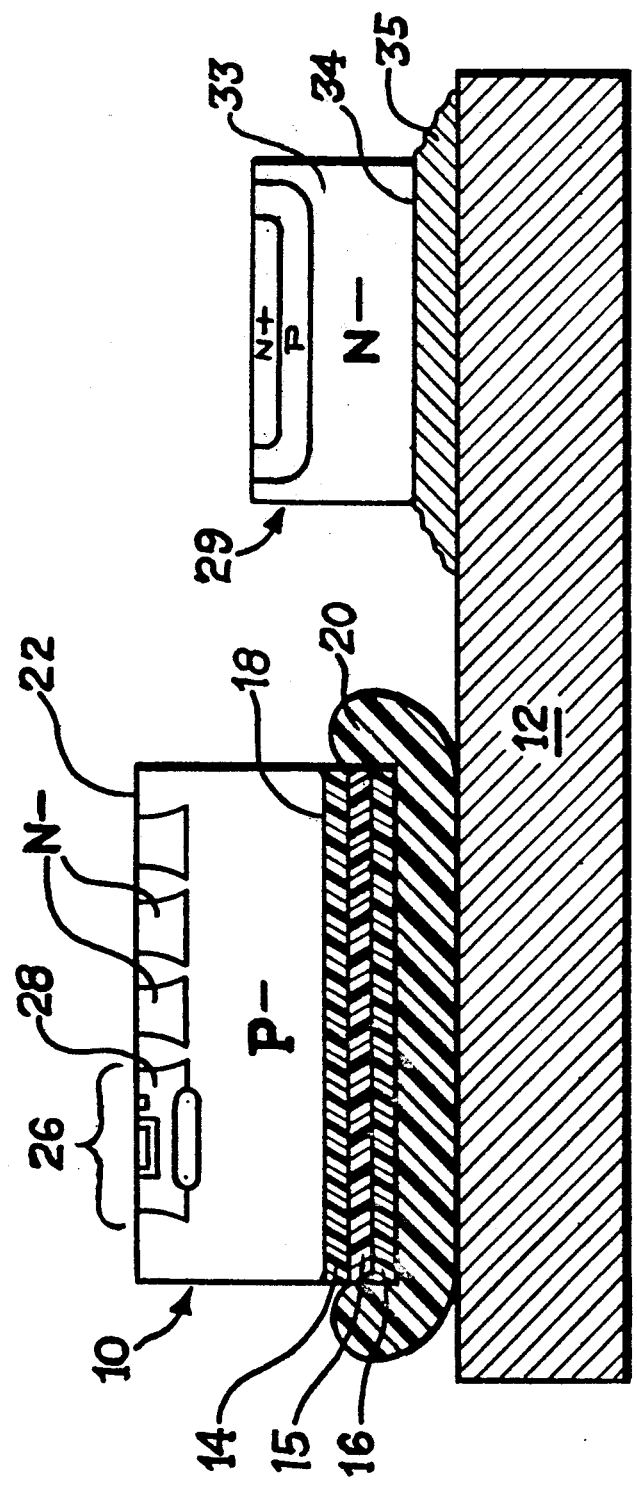

SEMICONDUCTOR DIE AND MOUNTING ASSEMBLY

BACKGROUND OF THE INVENTION

This invention relates to semiconductor die mounting means and more particularly to such die that are mounted to an electrically conductive substrate and dielectrically isolated therefrom.

Various methods for attachment and mounting of semiconductor die are performed, based on device circuitry to lead frame electrical and thermal relationships. Discrete high power devices require excellent thermal as well as electrical conduction. One method of attachment comprises sputtering gold onto the die mounting face and bonding the die to the metal substrate (lead frame) by soldering or by means of a conductive resin, e.g. a silver loaded epoxy resin may be disposed between the two surfaces. Integrated medium or low power semiconductor circuits that do not require either electrical or thermal conduction to the die back side are typically attached by a non-conductive epoxy between the two bonding surfaces.

It is also known to bond the back face of a semiconductor die to a substrate by means of a dielectric material, e.g. epoxy resin, polyimide, and the like. In such cases, the substrate is generally not conductive but is itself a dielectric, e.g. an alumina substrate. On the other hand, there are instances wherein a high thermal but dielectric connection is made between one face of a high-power handling semiconductor die and a metal heat sink. This is often accomplished by growing a non-conducting oxide on the die face to be thermally contacted and either bonding the oxide carrying face by a resin to the heat sink or spring loading the die face against the heat sink usually with a thin layer of a grease therebetween.

None of the above mentioned prior art die-mounting means are suitable for those situations wherein a high dielectric breakdown voltage must be maintained between the die mounting face and a conducting substrate. The silicon dioxide and grease layers are too thin, i.e. cannot be relied upon to withstand voltages greater than about 200 volts. Also, the complicating spring-loaded feature is costly. A simple dielectric-resin bonding means can be used. To do so requires unusual care to dispense the desired amount of liquid resin to the substrate and then to place the die in the liquid resin so that there is everywhere a minimum thickness of the resin between die and substrate to guarantee the desired high voltage capability after the resin is cured. In general, that process is critical, costly and leads to low yields.

It is an object of the present invention to provide an economical, manufacturable and reliable assembly of a semiconductor die dielectrically mounted to a substrate capable of withstanding high voltages therebetween.

SUMMARY OF THE INVENTION

An assembly of a semiconductor die to a conductive support is comprised of a die having a uniformly thick dielectric resin coating adhered to the back face thereof and a resin bonding agent interposed between the uniform resin coating and the support to provide a reliable highbreakdown voltage isolation and mounting means between die and support.

The uniformly thick coating may be comprised of a plurality of resin layers each of which is uniformly thick. Polyimide resin layers are preferred.

The method for making the dielectrically mounted semiconductor assembly comprises forming and adhering a uniformly thick dielectric resin coating to the back face of a semiconductor wafer, dividing the wafer into a multiplicity of discrete die and bonding each die to a support employing a resin bonding agent interposed between the uniformly thick coating and the support. The uniform resin-coating forming process may comprise depositing one or more uniform dielectric resin films successively on the back face of the die. This is preferably accomplished by pouring liquid resin on the horizontally held wafer and spinning the wafer to render the film uniformly thin. Each spun film is cured or at least polymerized, before the next, if any, is deposited.

In general, any desired coating thickness and any level of dielectric withstanding voltage may be realized by providing a sufficient number of dielectric layers to form the coating. It is that uniformly thick coating on the back face of each die that is relied upon to provide a predictable, reliable dielectric isolation between the die and the mounting support.

Thus, the die may be operated at high voltages of 200 volts and several orders of magnitude greater voltages with respect to a conductive support member. Metal lead frame supports may be used. Alternatively, the support may be comprised of a thick film circuit having film components, such as resistors and capacitors, interconnected by printed wiring patterns on a major surface thereof. Such film circuitry is usually protected by a thin overlying layer of a dielectric material. When a die of this invention is mounted over that film circuitry, whether or not that circuitry is protected by such a dielectric layer, the breakdown voltage between die and underlying film circuitry is reliably established at a predetermined high value by the uniform coating on the back face of the die.

BRIEF DESCRIPTION OF THE DRAWING

The FIGURE shows in side sectional view an assembly of this invention including an integrated circuit semiconductor die adhesively mounted to a metal supporting substrate by layers of dielectric material.

DESCRIPTION OF THE PREFERRED EMBODIMENT

Referring to the FIGURE, a silicon die 10 is shown bonded to a metal supporting substrate 12. Insulating resin layers 14, 15 and 16 are bonded to the lower (as shown) or back face 18 of the die 10. These layers 14, 15 and 16 constitute a dielectric die coating that is in turn bonded to the metal substrate 12 by means of an intermediate bonding resin 20. The resin 20 is also preferably, but not necessarily, a non-conducting dielectric material.

The silicon die 10 in this embodiment is a silicon integrated circuit comprised of semiconductor devices formed in the upper and opposite major face 22 of the die 10. One of these devices is a standard double diffused NPN transistor 26 formed in one of the N-type epitaxial pockets 28. The conventional aluminum wiring and passivation films are omitted to simplify the drawing.

The method by which the assembly shown in the FIGURE is made begins at a point in a standard process for making the semiconductor die themselves wherein a plurality of integrated circuits are been formed in one major surface of a semiconductor wafer. Semiconductor silicon wafers such as that typically contain hundreds of integrated circuits in a matrix of rows and columns of essentially identical integrated circuits. Such wafers (not shown) are typically from 200 to 500 microns thick and may have a diameter of from 3 to 6 inches (7.6 to 15 cm).

At this point, at least one thin uniformly-thick layer 14 of a non-conductive (dielectric) resin is deposited on the other and opposite major (back) surface of the wafer. In this embodiment, this layer is a layer of polyimide that is deposited by pouring a liquid polyimide on the opposite wafer surface 18 and spinning the wafer to obtain a thin liquid polyimide resin coating there.

The spinning step is carried out in essentially the same manner and with the same equipment that is conventionally employed for forming uniformly thin layers of photoresist on wafer surfaces. Such photoresist layers are converted to photoresist masks for the selective doping, etching, and contacting steps that are required for making transistors, integrated circuits and the like. The wafer is mounted on a horizontal table surface that is perforated so that it may serve as a vacuum chuck for holding the wafer. The table surface with held wafer is then caused to spin in a horizontal plane while liquid photoresist is poured onto the wafer at about the axis of spinning.

In one experiment, the liquid polyimide resin was diluted so that it had a viscosity of about 3000 centipoise. Each polyimide layer was spun at 2000 rpm and cured for 60 minutes at 400° C. and was about 6 microns thick. Cured polyimide has a voltage witholding strength of about 170 volts/micron so that one of these 6 micron layers can withstand about 1000 volts and two will break down at well over 200 volts, and more specifically at about 2000 volts.

It should be noted here that in a particular case the number of subsequent layers that will be needed is based on such factors as the required dielectric withstanding voltage, the dielectric field strength of the resin and the resin layer thickness that is being adhered. The third layer 16 and additional layers (not shown) may be formed sequentially after cooling by repeating those two steps of depositing and curing a number of times until the cured layers reach a desired cumulative thickness.

The individual integrated circuits formed in the major surface 22 of the wafer are now separated by a conventional diamond saw cutting step. Each individual die 10 includes a uniform dielectric coating on the back face 18. A drop of liquid uncured epoxy 20 is deposited on a copper lead frame finger 12 and, using a standard vacuum die-pick-up mechanism, a die 10 is transported over the lead frame 12 and inserted into the epoxy droplet 20.

It is very difficult to control how far into the epoxy droplet the die-pick-up mechanism will push the die before releasing it there and, therefore, the thickness of the epoxy 20 between the die 10 and the copper support 12 is poorly controlled and unpredictable. However, the uniform polyimide coating comprised of layers 14, 15 and 16 on the back face of the die 10 guarantees a minimum dielectric strength between die and support and the epoxy bonding agent is now not a factor determining die isolation quality.

The epoxy 20 is then cured, typically at 170° C. for an hour.

There is also shown in the FIGURE another semiconductor chip 29. This chip may be a discrete power transistor, the bottom face 34 being a boundary of the collector 33 of that transistor. A layer of solder 35 bonds the die to the support 12. A thin film of sputtered metallization (not shown) is deposited on the die back face 34 prior to soldering. The copper support 12 serves both as a heat conductor and an electrical conductor of collector current from the power transistor 29. This particular embodiment illustrates only one of many situations wherein a low voltage semiconductor device and a high voltage semiconductor device are electrically isolated but mounted to a common support.

The steps by which the power transistor 29 is mounted to the copper support pad or finger 12 may be executed before the mounting of the integrated circuit die 10. These steps may comprise placing a solder preform on a surface portion of the copper lead frame pad or finger 12. The finger 12 and preform are heated to reflow the solder. The die 29 is placed in the molten solder and this assembly is then cooled to solidify the solder.

The dielectric back coating on the die of this invention may more generally be any high quality dielectric resin other than polyimide. For example, it may be an epoxy resin. Also, bonding agents other than an epoxy resin may be employed instead of the mounting layer 20. For example, layer 20 may itself be of polyimide and need not be a high quality dielectric. In fact, it may contain particles rendering it thermally and electrically conductive. And in the method, the step for separating the die out of the wafer is preferably sawing but other means, such as laser cutting may be used.

What is claimed is:

1. A semiconductor die and mounting assembly comprising:
    (a) a semiconductor die having an electronic device formed in one major face thereof;
    (b) at least one uniform cured-liquid dielectric-resin coating self adhered directly to the other major face of said die;
    (c) a solid mounting support; and
    (d) a bonding agent disposed directly between said at least one dielectric coating and said support.

2. The assembly of claim 1 wherein said mounting support is electrically conductive.

3. The assembly of claim 1 wherein said solid mounting support is a metal.

4. The assembly of claim 1 wherein said dielectric resin coating is polyimide.

5. The assembly of claim 1 wherein said bonding agent is selected from an epoxy resin and a polyimide resin.

6. The assembly of claim 1 wherein said bonding agent is electrically conductive.

* * * * *